United States Patent [19]

Petry

[11] Patent Number: 5,119,266

[45] Date of Patent: Jun. 2, 1992

[54] ELECTROMAGNETIC INTERFERENCE FILTER PROTECTION CIRCUIT

[75] Inventor: Edward M. Petry, Centerport, N.Y.

[73] Assignee: Ail Systems, Inc. (subsidiary of Eaton Corp.), Deer Park, N.Y.

[21] Appl. No.: 458,768

[22] Filed: Dec. 29, 1989

[51] Int. Cl.⁵ .............................................. H05K 7/20
[52] U.S. Cl. .................................. 361/111; 361/388; 361/399
[58] Field of Search ............. 361/111, 113, 58, 15–17, 361/386, 388, 399

[56] References Cited

U.S. PATENT DOCUMENTS

| | | | |
|---|---|---|---|
| 3,614,539 | 10/1971 | Hallenbeck | 361/331 |
| 3,880,493 | 4/1975 | Lockhart, Jr. | 357/51 |
| 3,881,137 | 4/1975 | Thanawala | 307/105 |
| 4,209,754 | 6/1980 | Shiki et al. | 361/321 |
| 4,668,873 | 5/1987 | Ohba et al. | 307/9.1 |
| 4,808,843 | 2/1989 | Hedin | 361/113 |
| 4,843,513 | 6/1989 | Edris | 361/113 |
| 4,949,220 | 8/1990 | Tashiro | 361/386 |

Primary Examiner—Todd E. DeBoer
Attorney, Agent, or Firm—Hoffmann & Baron

[57] ABSTRACT

A protection circuit for use with an electromagnetic interference filter used in conjunction with a three phase power circuit operating at a particular line frequency includes three capacitors which are coupled to the output terminals of the electromagnetic interference filter. The electromagnetic interference filter and the power circuit have a resonant frequency which is substantially equal to the line frequency. The capacitors of the protection circuit have values which are selected to change the resonant frequency of the electromagnetic interference filter and power circuit such that the resonant frequency is not substantially equal to the line frequency. A protection circuit assembly for use with an electromagnetic interference filter includes a base plate, three ceramic capacitors, three heat conducting substrates, and a protective cover which is mounted on the base plate. The capacitors are mounted on the heat conducting substrates, and the substrates are mounted on the base plate.

5 Claims, 8 Drawing Sheets

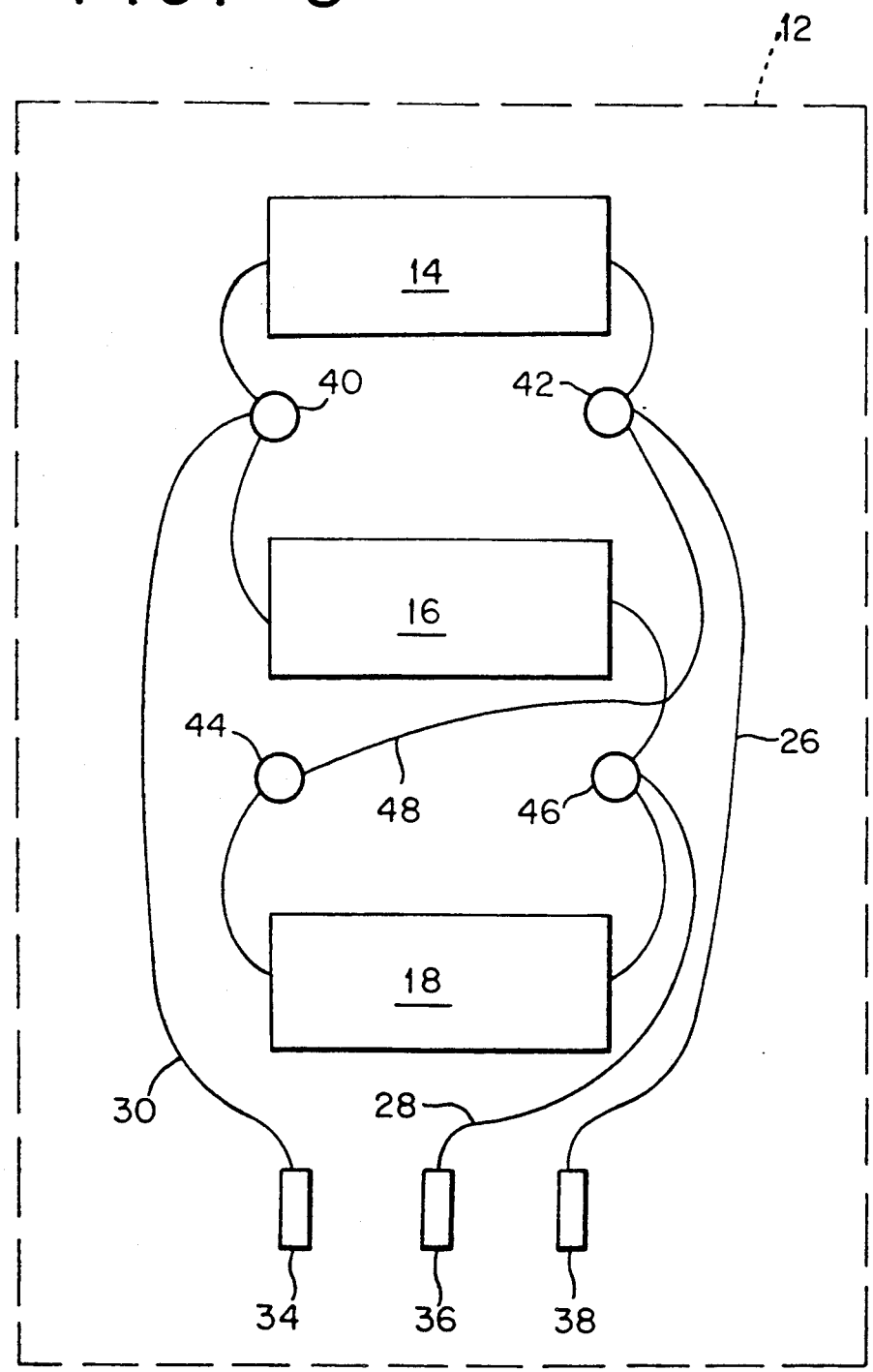

ELECTROMAGNETIC INTERFERENCE FILTER PROTECTION CIRCUIT

BACKGROUND OF THE INVENTION

1. Field of the Invention

The present invention relates to protection circuits for electromagnetic interference (EMI) filters and more particularly to circuits which protect EMI filters from damage due to overvoltage caused by the power transformer and EMI filter components combining to yield a resonant circuit with a center frequency equal to the line frequency of the power distribution system.

2. Description of the Prior Art

In the past, the components of EMI filters were protected from overvoltage by fuses which were calculated to cause an open circuit when excessive currents were drawn through them. The fuses were placed in series with the filter capacitors of the EMI filter. This would prevent high voltage transients from creating excessive currents through the capacitors of the filter.

Using solely a fuse to solve the problem of protecting EMI filters from component failures due to high voltage transients is inadequate in many respects. When the failure of an EMI filter capacitor opened the fuse, all EMI filtering ceased, and the circuit connected to the EMI filter was left with no electromagnetic interference protection. Furthermore, there was usually no indication to the operator that a filter capacitor has failed.

OBJECTS AND SUMMARY OF THE INVENTION

It is an object of the present invention to provide a method and circuit for protecting EMI filters used in power distribution systems from high voltage transients which could cause damage to the internal components of the filter that may render the filter useless.

It is a further object of the present invention to provide an EMI filter having enhanced protection capability for its components.

It is yet another object of the present invention to provide a method and circuit which extends the life of the internal components of an EMI filter used in a power distribution system.

An EMI filter basically includes one or more filter capacitors, and in many instances is connected to an inductive load, such as the primary windings of a power transformer. A protection circuit for such an EMI filter, in accordance with one form of the present invention, includes a capacitor connected between the output of the EMI filter which is to be protected and to ground or the neutral power line. The protection capacitor is of a specific value which is calculated to change the resonant frequency of the components of the filter in combination with the inductance of the load.

For a 3 phase AC power system, the EMI filter will have three outputs, one for each power phase. A protection circuit for such an EMI filter will include three capacitors, each capacitor connected between two terminals or outputs of the EMI filter in a line-to-line configuration. Each capacitor is identical and is preferably capable of operating at about 398 volts rms (for about a 230 volt power system).

The EMI filter protection circuit is capable of moving the resonant frequency of the EMI filter, in combination with the inductive load, to a frequency which is present at very low levels and thus produces much lower peak voltage levels.

In one form of the invention, the EMI filter protection capacitors are external to the EMI filter, and require no modification to the existing equipment and have a greater life than the fuses used in the prior art. Alternatively, an EMI filter may be formed with additional capacitors connected between the existing filter capacitors of the filter.

A protection circuit assembly, formed in accordance with the present invention, includes a base plate, at least one capacitor, and a heat conducting substrate. The capacitor is mounted on the substrate which, in turn, is mounted on the base plate. The assembly may be encapsulated, and may further include a protective cover mounted on the base plate and covering the capacitor.

A preferred form of the EMI filter protection circuit as well as other embodiments, objects, features and advantages of this invention will be apparent from the following detailed description of illustrative embodiments thereof, which is to be read in connection with the accompanying drawings.

BRIEF DESCRIPTION OF THE DRAWINGS

FIG. 8 is a simplified pictorial representation of the assembly shown in FIG. 7, taken in plan view, showing the wiring of the various components of the assembly.

DETAILED DESCRIPTION OF THE PREFERRED EMBODIMENTS

Figure 1:
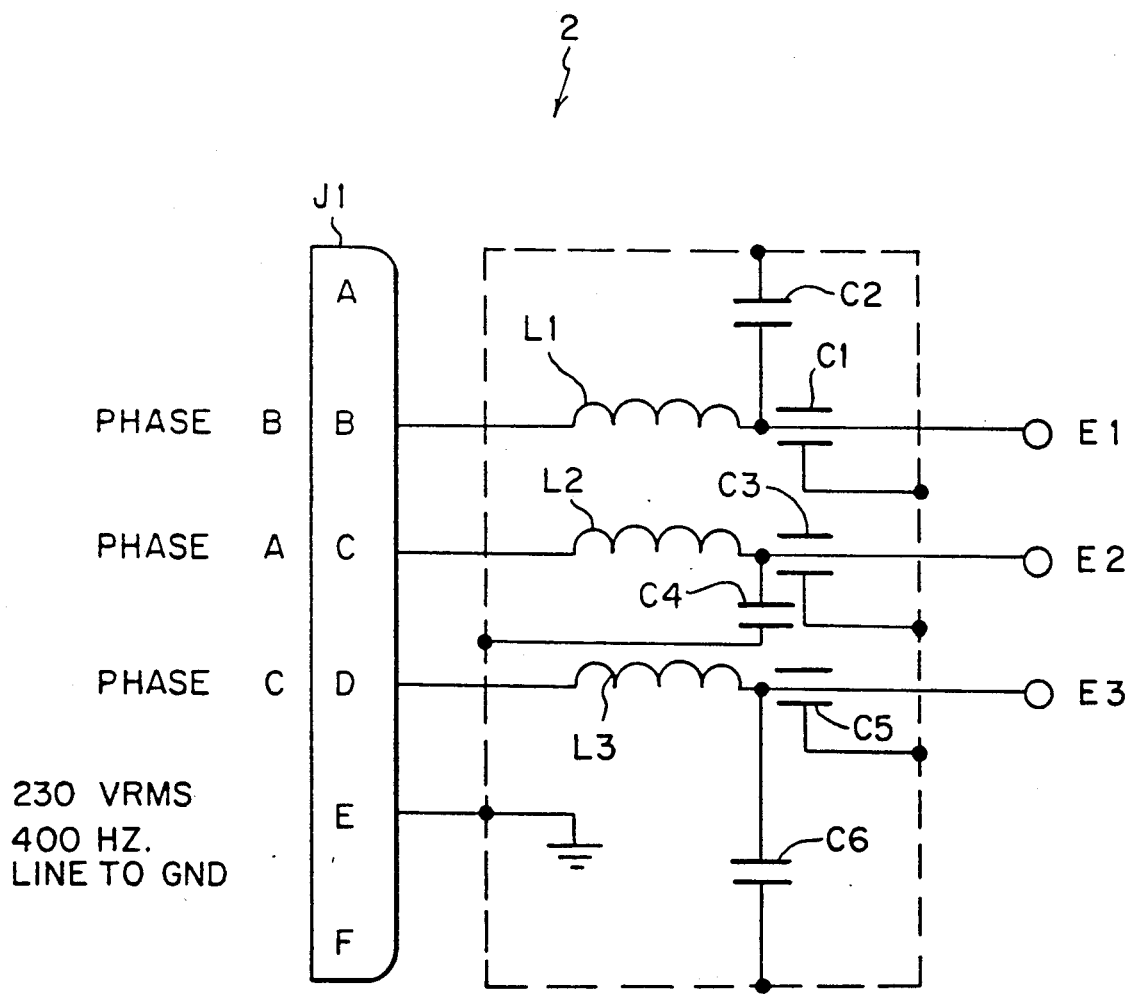
FIG. 1 is a simplified schematic diagram of a conventional electromagnetic interference (EMI) filter.

FIG. 1 shows a typical configuration of an EMI filter 2 which may be protected by the EMI protection circuit of the present invention. The EMI filter shown in FIG. 1 is designed for filtering a three phase power system, although it is envisioned that the invention is applicable to a protection circuit for a single phase EMI filter.

Figure 2:
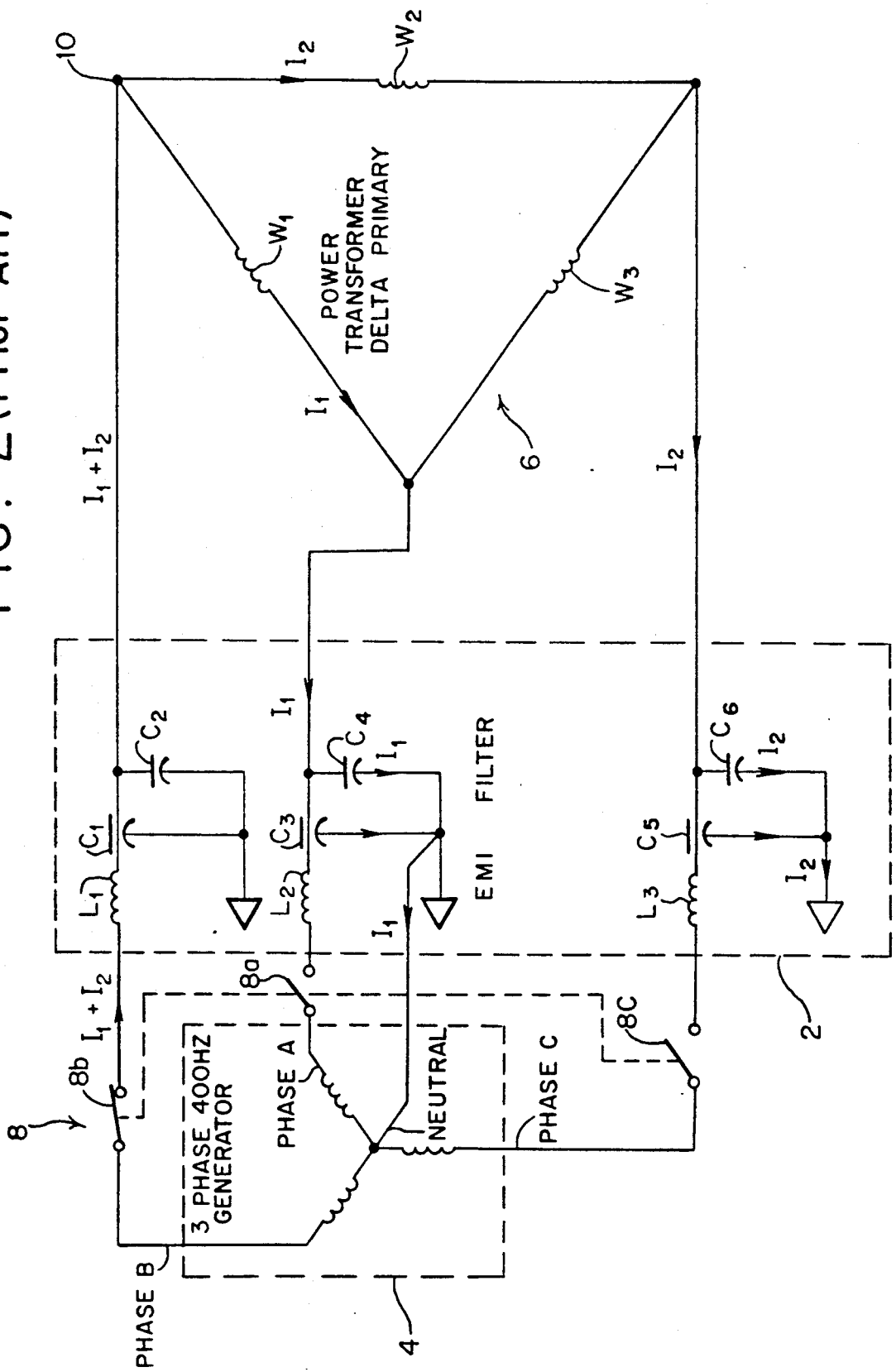
FIG. 2 is a schematic diagram of a conventional EMI filter connected to a power generator and a power transformer.

The EMI filter 2 basically includes a connector J1 which interfaces the filter to a three phase generator 4 (shown in FIG. 2). Three terminals of the connector (designated in FIG. 1 by the letters B, C and D) are each connected to a series inductor L1, L2, L3 in the filter, which creates a high impedance for any high frequency electromagnetic interference on the various phases. The EMI filter 2 also includes three bypass filter capacitors C2, C4, C6, each connected between the other end of the series inductors L1, L2, L3 and to ground or neutral. The bypass capacitors C2, C4, C6 provide a low impedance path to ground for these high frequencies.

The EMI filter 2 also includes three feed-through capacitors C1, C3, C5, each connected to the second side of a respective inductor L1-L3 and to ground or neutral. The feed-through capacitors C1, C3, C5 add an additional low impedance path to ground for any high frequency electromagnetic interference present on the various power phases, and present a point of connection or terminal (designated respectively as E1, E2 and E3) from the EMI filter to the next stage of circuitry which, as shown in FIG. 2, may be the primary windings of a three phase power transformer 6. Generator 4, EMI filter 2 and transformer 6 together typically define a power distribution circuit.

FIG. 2 is a simplified schematic of the generator 4, the EMI filter 2 connected to the generator, and the primary of the power transformer 6 connected to the EMI filter, under conditions which cause a resonant circuit to occur. It is under such conditions of resonance that large voltages may develop across the bypass filter capacitors C2, C4, C6 of the EMI filter, thereby destroying the capacitors. The EMI filter protection circuit of the present invention is designed to change the resonant frequency of this resonant circuit, thereby lowering the potentially harmful voltages which can be created under such circumstances, as will be described in greater detail.

The series tuned or resonant circuit formed by the combination of the three phase generator 4, the EMI filter 2 and the primary windings of the three phase power transformer 6 usually only occurs upon initial turn-on of the power distribution system. More specifically, it is been found that the problem occurs most often when two conditions during power up exist. First, there is a slight delay (for example, 0.5 seconds) in providing power to the circuit which is driven by the secondary winding of the power transformer 6 after the switch 8 connecting the three phase generator 4 to the EMI filter 2 is turned on. Due to this delay, the transformer 6 is unloaded, and its primary winding is equivalent to a relatively high Q inductor.

Second, the condition may occur if all three phases of the power from the generator are not simultaneously provided to the EMI filter. This may result from the three phases being connected to individual single pole switches which are mechanically ganged together to form the power switch 8 or a relay between the generator and the EMI filter. Accordingly, one phase may electrically connect to the EMI filter before the other phases do.

To facilitate an understanding of the problem, phase B of the AC power generator 4 is shown connected to the EMI filter 2 through its associated switch 8b, while phases A and C are shown as interrupted. As stated previously, this situation may occur when a relay, circuit breaker or ganged switch is closed to apply AC power to the EMI filter, and the three contacts of the relay, circuit breaker or switch do not close simultaneously. There can be a delay of 20 milliseconds or more between the application of AC power on the individual phases.

The upper phase, identified as phase B in FIG. 2, provides current $I_1+I_2$ through the EMI filter to one node 10 of the transformer's primary winding (shown in a conventional delta configuration consisting of three winding portions W1, W2, W3). Here the current splits into two components: current $I_1$ flows through transformer winding W1, while current $I_2$ flows through winding W2. Current $I_1$ then passes through EMI filter capacitors C3 and C4, and back to the generator's neutral line. Current $I_2$ passes through EMI filter capacitors C5 and C6, and u then flows back to the generator neutral. Negligible current flows through transformer winding W3.

Many forms of circuits provide a delay after turn-on of the power before providing power to the actual circuitry driven by the power distribution system. This delay, as mentioned previously, may be 0.5 seconds or more after turn-on. Under such circumstances, there is no load on the transformer's secondary windings. Thus, the transformer is unloaded, and its primary is equivalent to a relatively high Q inductor. Under such circumstances, winding W1 is in series with capacitors C3 and C4, and together they comprise a series tuned circuit. With no load on the transformer's secondary winding, and only one phase of AC connected to the EMI filter (i.e., phase B shown in FIG. 2), sustained voltages as high as 800 volts peak across the EMI filter capacitors in the unenergized phases (i.e., phases A and C and their associated bypass filter capacitors C4 and C6, respectively) have been measured. This voltage corresponds to 566 volts rms. Such filter capacitors are rated at 240 volts rms, and 566 volts rms represents a serious overvoltage which may cause failure of the filter capacitors after repeated power applications.

Again referring to FIG. 2 of the drawings, assume that the switch portion 8a controlling phase A is now also closed, and only the phase C power line is interrupted by switch portion 8c. This condition would cause excess voltage across capacitors C5 and C6 corresponding to the phase C circuit. Under such conditions, 650 volts peak across the filter capacitor C6, when two phases (i.e., phases A and B) are energized has been measured. This voltage corresponds to 460 volts rms, which is also an over-stressed condition for the filter capacitors.

With all three phases energized simultaneously, each filter capacitor of the EMI filter is subjected only to the normal 230 volts rms AC line-to-neutral voltage, and no resonance will occur since the generator's low impedance lowers the Q below the point of critical damping. Q multiplication and excess voltage usually only occur when one or more phases of the AC power input to the EMI filter are open.

Figure 3:
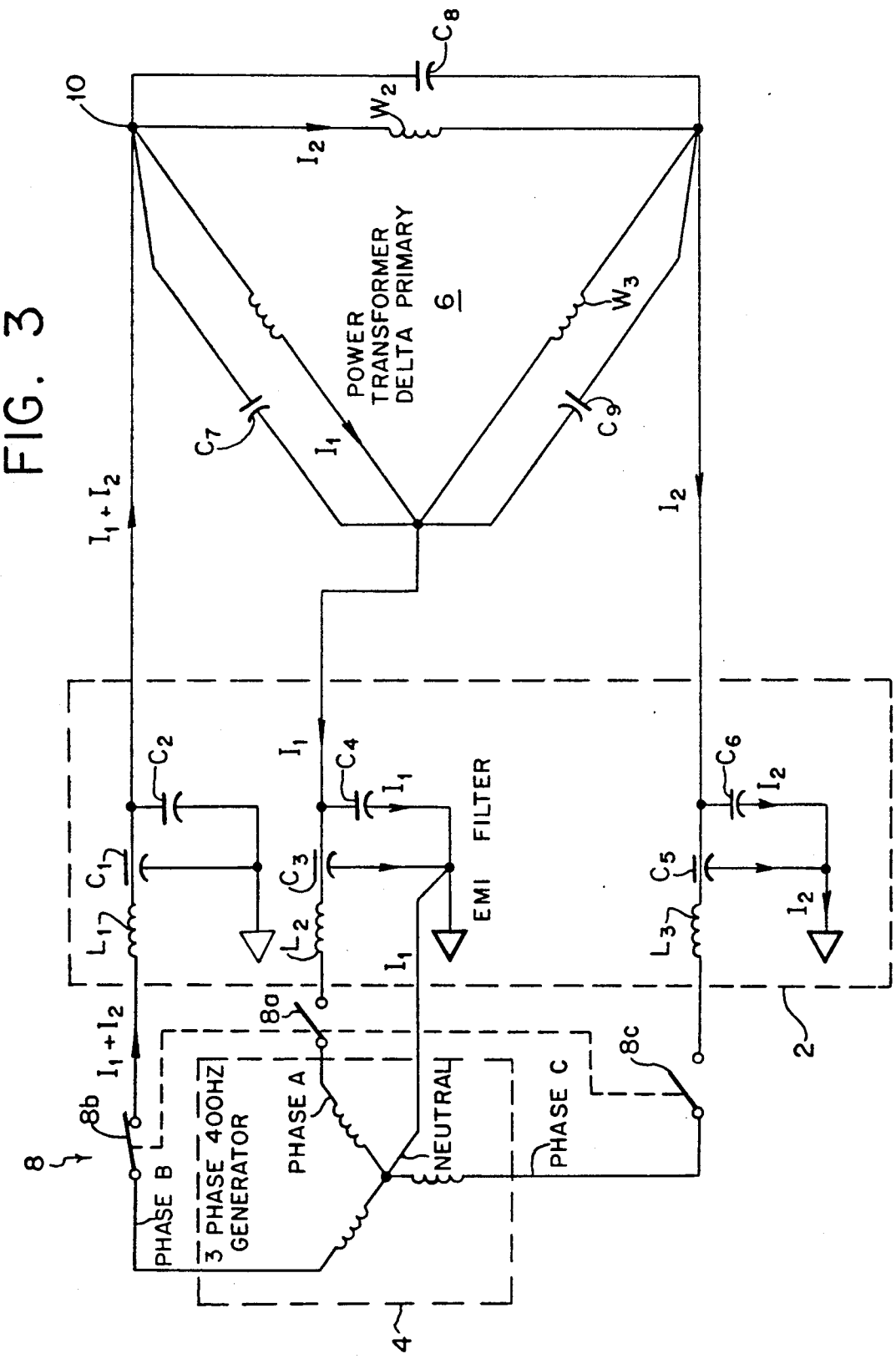
FIG. 3 is a schematic diagram of one form of the protection circuit of the present invention connected to the EMI filter and other circuitry shown in FIG. 2.

FIG. 3 is a schematic of the generator 4, EMI filter 2 and power transformer 6, all of which were shown in FIG. 2, modified to include one form of an EMI filter protection circuit of the present invention. The protection circuit basically includes three capacitors C7, C8 and C9, connected in a line-to-line configuration, that is, each capacitor being connected between two terminals or outputs of the EMI filter. Stated another way, and as shown in FIG. 3, capacitor C7 is connected across (i.e., in parallel with) winding W1 of the primary winding of the power transformer 6, shown in a conventional delta configuration, capacitor C8 is connected in parallel with winding W2 of the primary winding of the transformer, and capacitor C9 is connected in parallel with winding W3 of the transformer. The values of C7, C8 and C9 were selected to move the resonant frequency of the power distribution circuit from the line frequency to a non-critical frequency and to provide sufficient attenuation or damping at the line frequency.

Figure 4:
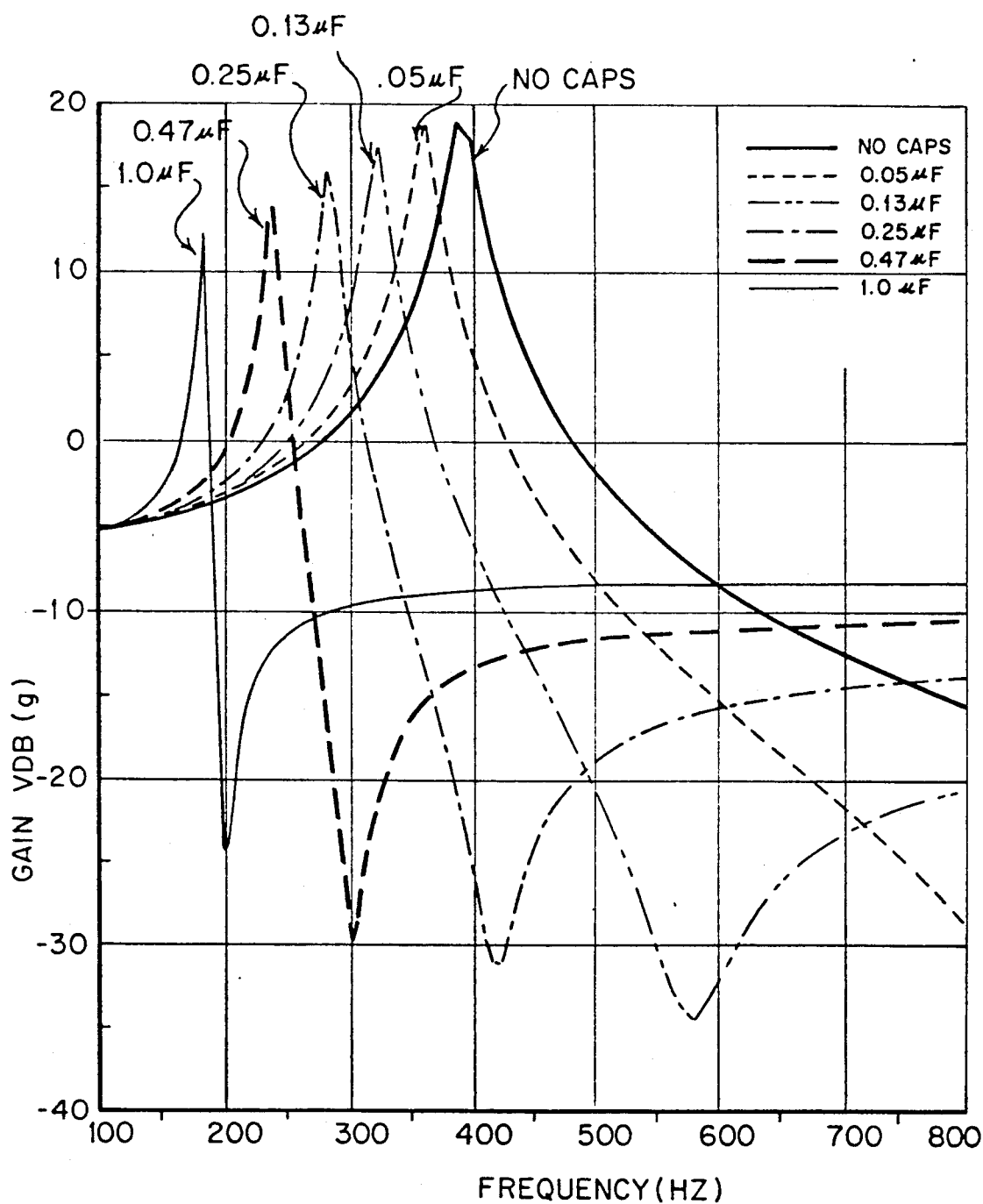
FIG. 4 is a graph of the response signal through an EMI filter with the protection circuit of the present invention connected to it.

A computer model was generated and an analysis made of the resonant peaking response resulting from the application of two phases of input power with the absence of the third phase. Under these conditions, the resonant frequency of the power distribution circuit (i.e., the combination of the generator 4, the EMI 2 filter and the transformer 6) is equal to $\frac{1}{2}\pi\sqrt{LC}$, where L is the equivalent inductance of the primary of the power transformer 6 and C is the combined value of two of the internal EMI filter capacitors C2, C4, and capacitors C1 and C3. The peaking response is shown in FIG. 4 of the drawings.

More specifically, the circuit of FIG. 3, shown with the protection circuit of the present invention, was analyzed with a computer. Each of the parallel configurations of C1 and C2, C3 and C4, and C5 and C6 were set equal to 0.55 microfarads, and C7, C8 and C9 were varied from open circuit (i.e., C7-C9 were not connected to the circuit) to one microfarad. The computer analysis recreated the application of power in the following sequence: first phase A power was applied to the EMI filter; then phase B power was applied; and finally phase C power was applied to the EMI filter. The secondary winding of the power transformer was left unloaded to recreate the delay in powering up the circuit which it drove. These conditions, as described previously, allowed the unloaded circuit resonance to occur. It should be noted that the opposite power-down sequence does not allow the circuit to resonate, as it is fully loaded at the time of power-down.

The particular value of the protection capacitors C7-C9 is selected primarily to reduce the resonant frequency below (or above) the line frequency which, in the computer analysis and circuits described previously, is 400 Hz, while reducing the amplitude of the peaking response. As shown in the graph of FIG. 4, 0 dB represents a nominal line-to-neutral voltage of 230 volts AC at 400 Hz. The values of capacitance listed in the legend of FIG. 4 represent the values of protection capacitors C7, C8 and C9 used in the configuration illustrated by FIG. 3.

The computer model used a transformer model based on the fundamental magnetizing inductance model presented in a PEI and Lauritzen IEEE paper entitled *A Computer Model Of Magnetic Saturation And Hysteresis For Use On Spice* 2. FIG. 4 indicates the results for an AC swept response driving two inputs of an EMI filter, such as the inputs connected to capacitors C1 and C3 in FIG. 3, and observing the output at the open phase input across filter capacitor C5.

As shown in the graph of FIG. 4, with no protection capacitors installed across the EMI filter, the resonance of the power distribution circuit peaks just below the normal line frequency of 400 Hz. To reduce this resonant frequency, protection capacitors C7-C9 are preferably placed from line-to-line as shown in the configuration of FIG. 3 to reduce the amount of voltage across the parallel combinations of C1 and C2, C3 and C4, and C5 and C6.

At 400 Hz with no protection capacitors installed across the output of the EMI filter, the circuit produces +17 dB gain, where 0 dB represents the incoming line-to-neutral voltage of 230 volts AC. Using a 0.25 microfarad capacitor for each of capacitors C7, C8 and C9, the most attenuation is provided, that is, −28 dB at 400 Hz. Further tests, however, reveal that a larger value of protection capacitance was more desirable when only one phase at a time was switched on and off. Accordingly, a 0.47 microfarad capacitor for each of capacitors C7-C9 appears to be more appropriate, as it provided an attenuation value of −13 dB at 400 Hz, which is lower than a value of −9 dB found past the anti-resonance point of the 1 microfarad curve shown in FIG. 4.

Accordingly, a 0.47 microfarad capacitor for each of protection capacitors C7-C9 in a line-to-line configuration, as shown in FIG. 3, eliminated the resonance of the circuit at the line frequency of 400 Hz and provided an attenuation at the line frequency when less than all phases of the power were switched on simultaneously.

Figure 5:
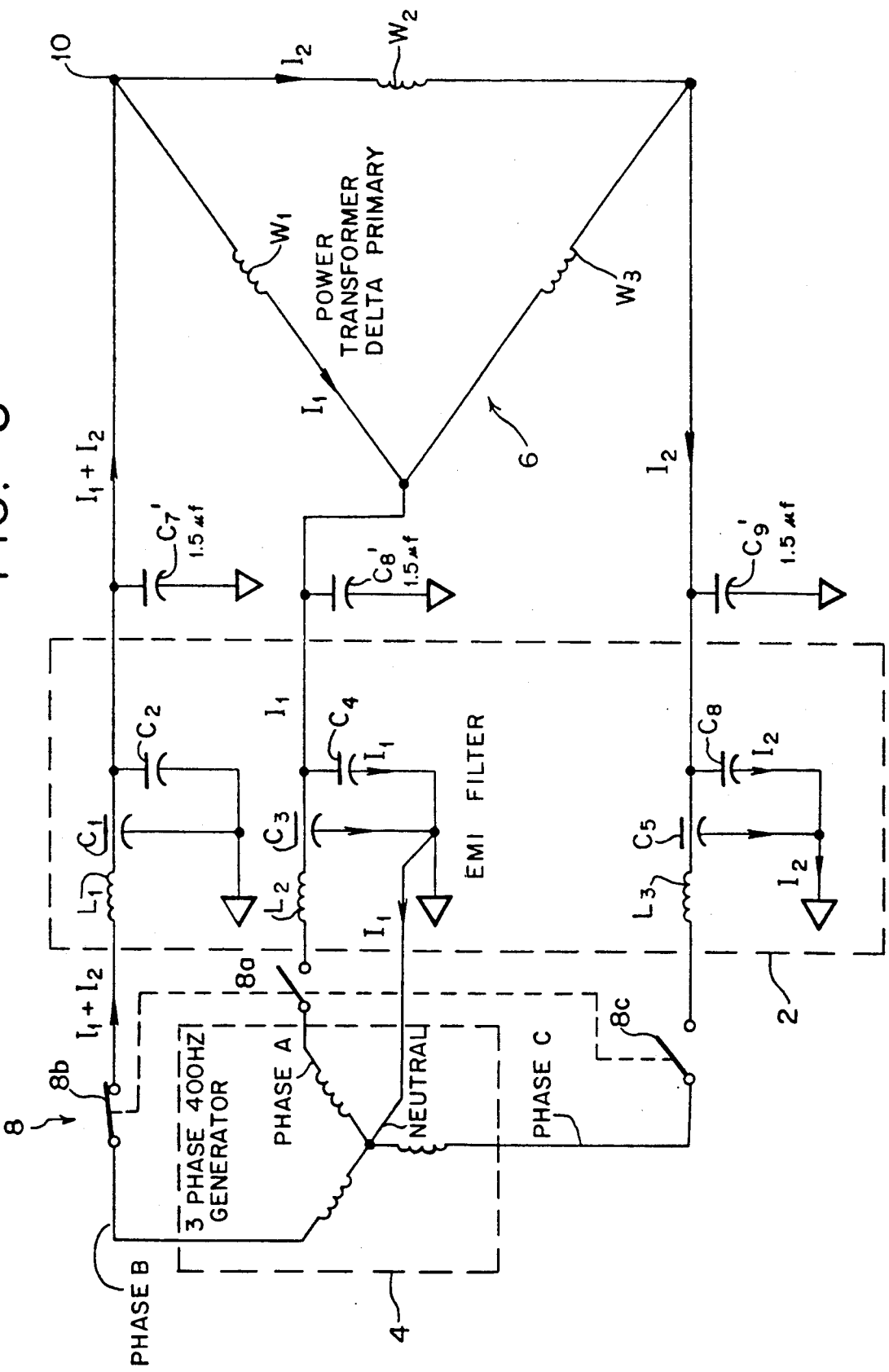
FIG. 5 is a schematic diagram of a second form of the protection circuit of the present invention connected to the EMI filter and other circuitry shown in FIG. 2.

An alternative configuration to the protection circuit of FIG. 3 is shown in FIG. 5. In this configuration, three protection capacitors C7', C8', C9' are included in the protection circuit, each protection capacitor being connected between a respective output of the EMI filter 2 and ground, that is, in a line-to-neutral configuration. Each capacitor C7'-C9' in the line-to-neutral configuration was optimally selected to have a value of 1.5 microfarads, as this value would be equivalent to a 0.47 microfarad protection capacitor in the line-to-line configuration shown in FIG. 3.

Figure 6:
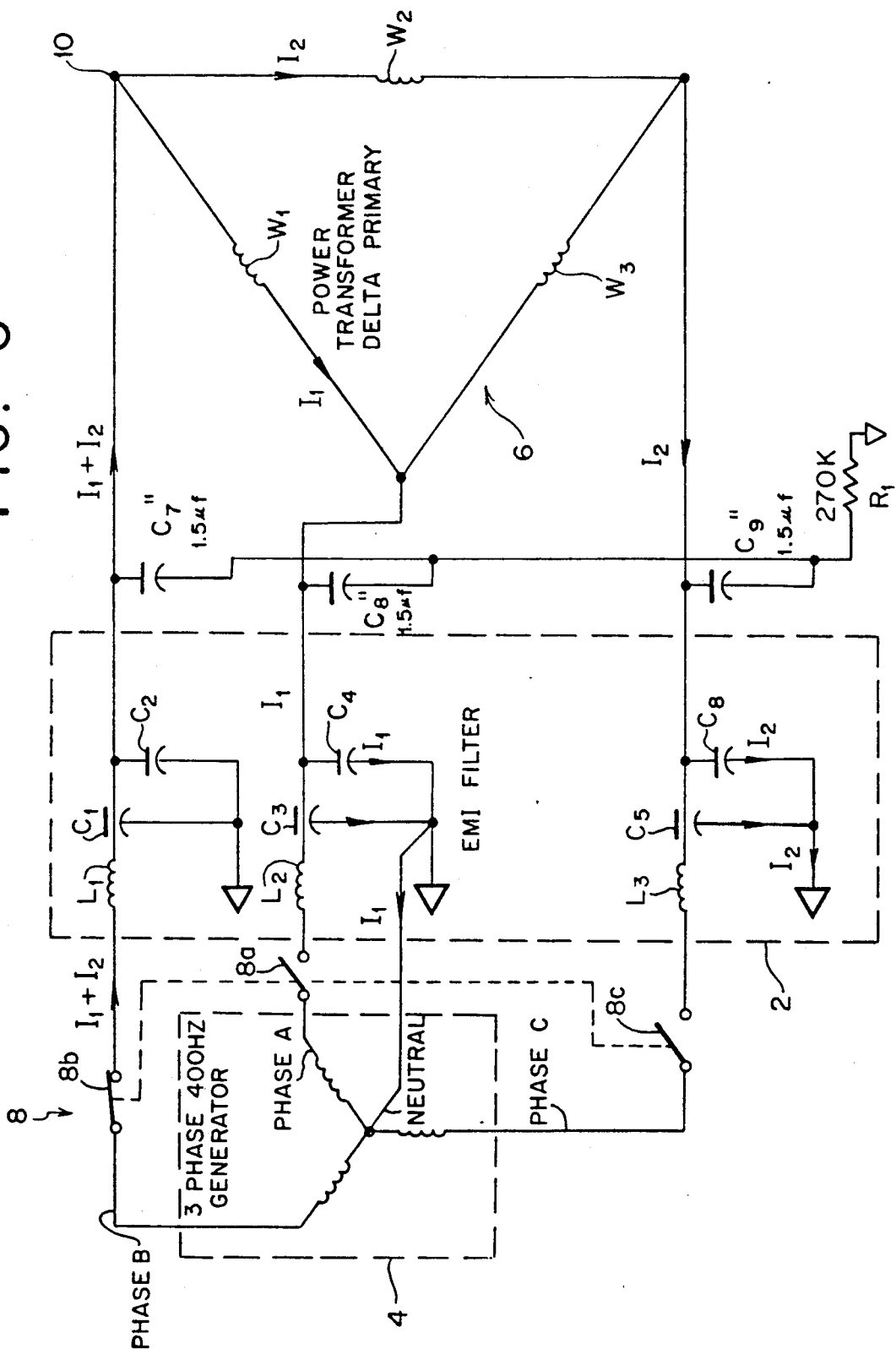
FIG. 6 is a schematic diagram of a third form of the protection circuit of the present invention connected to the EMI filter and other circuitry shown in FIG. 2.

In another form of the present invention, the protection circuit may be configured as shown in FIG. 6. The protection circuit would include three capacitors C7", C8" and C9", each being connected between a respective output of the EMI filter and one side of a resistor R1, the other side of the resistor being connected to ground, that is, in a line-to-resistor-to-neutral configuration. Preferably, resistor R1 is 270K ohms, and each of the protection capacitors C7"-C9" is 1.5 microfarads. In this configuration, the common connection of capacitor C7"-C9" is essentially floating because of the high value of resistor R1, as resistor R1 is used as a "bleeder" resistor to remove charge from the capacitors.

In many power distribution systems such as the type described and shown in FIG. 2, paper/oil filter capacitors having a foil construction is usually used. Such capacitors may fail due to corona breakdown when the CIV (corona inception voltage) of the capacitor is exceeded over a period of operation. Corona breakdown can especially occur at a point on the edge of the aluminum foil in the capacitor. The localized potential and electric stress field at this point has been found in certain applications to be 6 to 10 times greater than the normal potential across the capacitor.

As gas is released in the oil of such capacitors, it cascades towards further breakdown resulting in a corona "treeing" across the margin of the extended foil. The "treeing" eventually carbonizes, resulting in a conductive short through the foils. This produces a relatively rapid thermal runaway condition. Ultimately, the paper/oil dielectric and foil break down, resulting in gases which expand, and force the end of the capacitor free. The pressure build-up may be in excess of 150 psi. Accordingly, in many 400 volt AC line-to-line configuration power distribution applications, presently used paper/oil capacitors may not be suitable.

For the above reasons, it is preferred that the protection circuit of the present invention uses ceramic capacitors as opposed to the paper/oil type. Ceramic capacitors have a much higher CIV rating and thus can withstand electric stress better than the paper/oil type.

Another advantage of ceramic capacitors is that, when they fail, they produce a strong short, not a momentary short as with the paper/oil type of capacitors. The paper/oil type of capacitors short out momentarily, rapidly overheat and "blow up", and thus become an open circuit. The momentary short may be insufficient to trip the power distribution circuit breakers. Accordingly, the loss of a filter capacitor may go undetected.

With many ceramic capacitors and, in particular, those used in the present invention, the capacitor creates a strong short which is sufficient to trip a circuit breaker in the power distribution system, and thus provide fault isolation data to the system.

Figure 7:
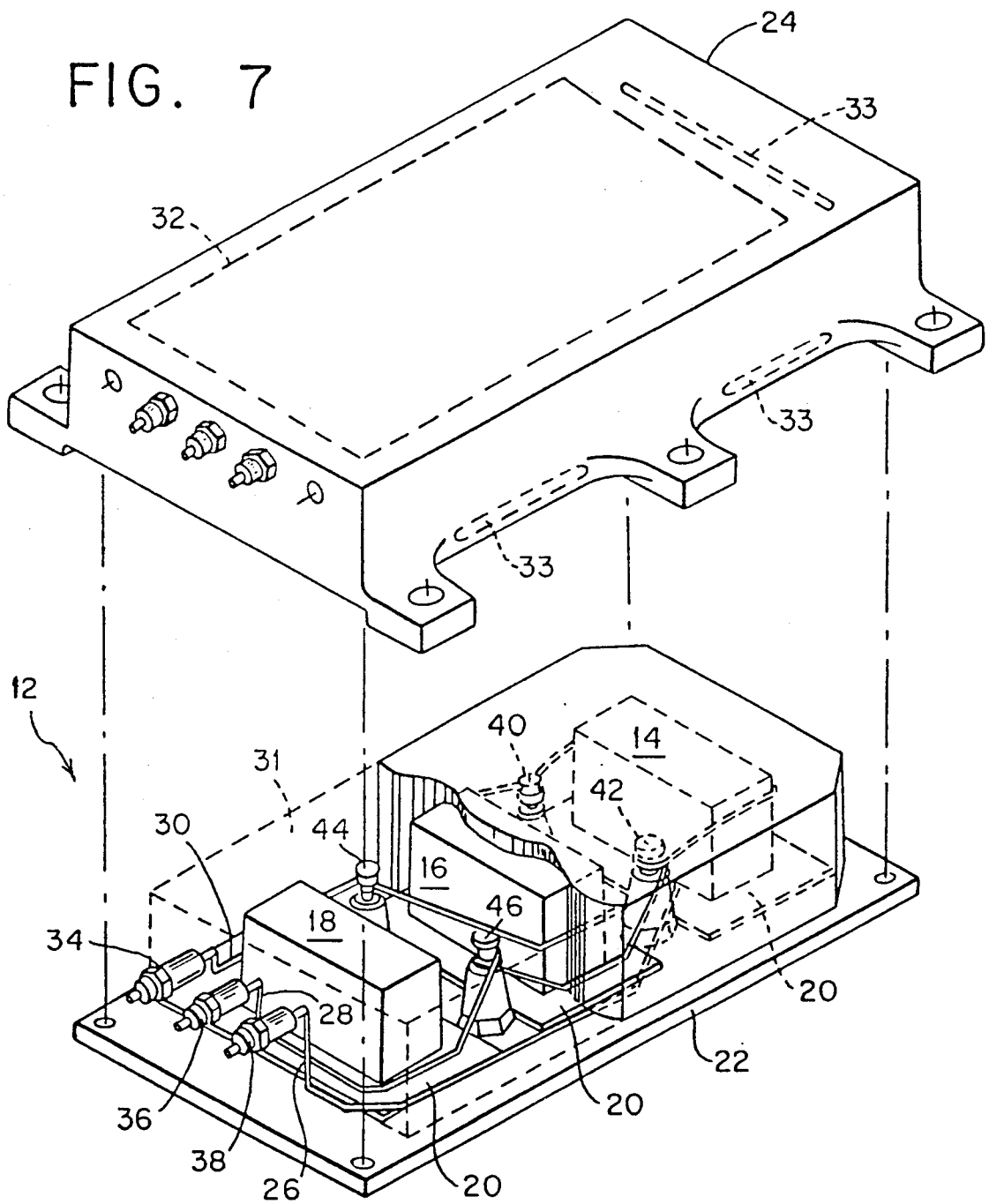
FIG. 7 is a partially exploded view, in perspective, of a protection circuit assembly formed in accordance with the present invention.

FIGS. 7 and 8 illustrate a protection circuit assembly 12 formed in accordance with the present invention. The protection circuit assembly 12 is adapted to be connected to the outputs of an EMI filter, such as that described and shown in FIG. 2 of the drawings.

As shown in FIG. 7 of the drawings, the protection circuit assembly 12 includes three protection capacitors 14, 16, 18, each preferably having a value of 0.47 microfarads. Each capacitor 14-18 is preferably an N3300 type NPO multi-layer ceramic capacitor rated at 550 volts rms at 400 Hz, with a minimum CIV of 800 volts rms.

The ceramic capacitors which are preferably used have a low dissipation value, which is typically about 0.01% to about 0.1%. In addition, abraided brush wire leads are used on the capacitor, as opposed to solid leads. Solid leads may transmit vibrations to the end terminations in the capacitors and crack the end terminations, whereas abraided brush wire leads will substantially avoid this problem.

Each ceramic capacitor 14-18 is spaced apart from the others and is epoxied to a ceramic heat conducting beryllium oxide substrate 20. The substrates 20 are soldered to a copper-moly-copper (cu-moly-cu) base plate 22. This provides an excellent heat transfer structure as well as a good match for the thermal expansion coefficients of the various materials used in the assembly. The beryllium oxide substrates 20 provide voltage insulation between the cu-moly-cu base plate and the capacitors 14-18.

The protection circuit assembly 12 is preferably encapsulated in a mold 31. The encapsulant will minimize or eliminate any corona arcing from occurring at high altitutes in an unpressurized compartment. The surfaces of the assembly which are to be in contact with the encapsulant are primed to enhance the bonding properties needed to ensure a good seal. For encapsulation, a clear reversion resistant silicon encapsulant such as Silguard 184 TM is preferably used.

The protection circuit assembly 12 further includes a protective cover 24. When the assembly is encapsulated in a mold 31, approximately 0.04" clearance is provided from all interior walls of the cover 24 for expansion except the wall where three output lead wires 26, 28, 30 electrically connected to the capacitors 14-18 exit the encapsulating compound. The encapsulant at that end and over the top of the capacitors 14-18 preferably extends beyond the capacitors by 0.125".

The cover 24 is designed with an "O" ring 33 between the cover and the capacitor assembly base plate 22 to protect the encapsulant from contamination by a substance that may damage the encapsulant. The cover 24 further has a Mylar insulator 32 on its inside top surface to prevent arcing between the capacitors 14-18 and the cover, which cover is preferably made from metal.

Three threaded type "feed-through" terminals 34, 36, 38 are mounted on one end wall of the cover. The feed-through terminals 34-38 provide the means for the three lead wires 26-30 from the capacitors to effectively exit the protection circuit assembly. The three lead wires 26-30 are soldered to the terminals 34-38, RTV is locally applied to cover exposed electrical conductors, and after curing, the cover 24 is attached to the base plate 22 of the assembly by four screws (not shown).

Four stand-off terminals 40, 42, 44, 46 are mounted on the base plate terminals 22 with two stand-off terminals being positioned between adjacent pairs of capacitors 14-18. The leads of the capacitors 14-18 are connected to the stand-off terminals 40-46, and the three lead wires 26-30 are used to connect the capacitors to the feed-through terminals 34-38.

More specifically, and as shown in FIG. 8 of the drawings, the leads of capacitor 14 are connected to stand-off terminals 40 and 42 respectively. The leads of capacitor 16 are connected to stand-off terminal 40 and stand-off terminal 46. The leads of capacitor 18 are connected to stand-off terminal 44 and stand-off terminal 46. A jumper wire 48 connects stand-off terminal 44 to stand-off terminal 42. A first lead wire 26 is connected between stand-off terminal 42 and the third feed-through terminal 38. A second lead wire 28 is connected between stand-off terminal 46 and the second feed-through terminal 36. A third lead wire 30 is connected between stand-off terminal 40 and the first feed-through terminal 34. Accordingly, the protection circuit assembly is wired in a line-to-line configuration, as shown schematically in FIG. 3 of the drawings. The three feed-through terminals 34-38 of the protection circuit assembly are connectable to the three output terminals of the EMI filter.

The protection circuit of the present invention changes the resonant frequency of an EMI filter to minimize the possibility of damage to the filter capacitors in the EMI filter due to overvoltage transients. The circuit in effect extends the life of the internal components of the EMI filter. The use of ceramic capacitors in the protection circuit assembly, with its high CIV characteristics, minimizes the chances of corona arcing.

Although an EMI filter and protection circuit for an EMI filter for use with a three phase, 400 Hz power system has been described and shown in the drawings, it is envisioned that the invention is applicable to a single phase power circuit to change the resonant frequency of the power circuit from the line frequency when providing or removing power from the circuit in order to prevent overvoltage transients from damaging the filter capacitors and other components used in the EMI filter associated with the power circuit. Potential corona arcing is minimized and contained by encapsulating the protection circuit assembly. This provides safer operation in environments in which arcing could be hazardous or dangerous.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A protection circuit assembly for use with an electromagnetic interference filter associated with a three phase power circuit, which comprises:
 a base plate;
 three ceramic multi-layer capacitors;
 three heat conducting substrates, each capacitor being mounted on a respective heat conducting substrate, each substrate being mounted on the base plate, the ceramic capacitors being spaced apart from each other;

a plurality of stand-off terminals, the stand-off terminals being mounted on the base plate and situated adjacent to the capacitors to allow the leads of the capacitors to be connected to the stand-off terminals;

a protective cover, the protective cover being mounted on the base plate and covering the ceramic capacitors; and a plurality of feed-through terminals, the feed-through terminals being electrically coupled to the capacitors and being adapted to be connected to the output terminals of an electromagnetic interference filter.

2. A protection circuit assembly as defined by claim 1, wherein the heat conducting substrates are formed from beryllium oxide.

3. A protection circuit assembly as defined by claim 1, wherein the base plate is formed from a copper-moly-copper material.

4. A protection circuit assembly as defined by claim 1, which further comprises:

an "O" ring being situated between the cover and the base plate.

5. A protection circuit assembly as defined by claim 1, which further comprises:

an insulator, the insulator being mounted on the inside surface of the cover and positioned at least between the capacitors and the cover.

* * * * *